United States Patent
Park et al.

(10) Patent No.: US 10,611,962 B2
(45) Date of Patent: Apr. 7, 2020

(54) ETCHANT COMPOSITION AND MANUFACTURING METHOD OF METAL PATTERN USING THE SAME

(71) Applicant: Samsung Display Co., Ltd., Yongin-Si, Gyeonggi-Do (KR)

(72) Inventors: Jong Hee Park, Yongin-si (KR); Ki Tae Kim, Osan-si (KR); Jin Seock Kim, Seongnam-si (KR); Gyu-Po Kim, Incheon (KR); Hyun-Cheol Shin, Incheon (KR); Dae-Woo Lee, Incheon (KR); Sang-Hyuk Lee, Incheon (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/391,222

(22) Filed: Apr. 22, 2019

(65) Prior Publication Data

US 2019/0322935 A1  Oct. 24, 2019

(30) Foreign Application Priority Data

Apr. 23, 2018 (KR) .................. 10-2018-0046632

(51) Int. Cl.
| | | |
|---|---|---|
| C09K 13/00 | (2006.01) | |
| C09K 13/06 | (2006.01) | |
| C23F 1/30 | (2006.01) | |
| C04B 41/91 | (2006.01) | |
| C04B 41/00 | (2006.01) | |
| C04B 41/53 | (2006.01) | |
| G03F 7/32 | (2006.01) | |

(52) U.S. Cl.
CPC ............ C09K 13/06 (2013.01); C04B 41/009 (2013.01); C04B 41/5353 (2013.01); C04B 41/91 (2013.01); C23F 1/30 (2013.01); G03F 7/32 (2013.01)

(58) Field of Classification Search
CPC ....................................... C09K 13/06
USPC ...................................... 252/79.1
See application file for complete search history.

(56) References Cited

U.S. PATENT DOCUMENTS

| | | |
|---|---|---|
| 7,141,180 B2 | 11/2006 | Park et al. |
| 7,357,878 B2 | 4/2008 | Park et al. |
| 8,785,224 B2 | 7/2014 | Ko et al. |
| 2014/0295626 A1* | 10/2014 | Park ............ C23F 1/18 438/151 |
| 2016/0348001 A1 | 12/2016 | Shigeta et al. |

FOREIGN PATENT DOCUMENTS

| | | |
|---|---|---|
| JP | 4756069 B2 | 8/2011 |
| JP | 5158339 B2 | 3/2013 |
| KR | 10-0853216 B1 | 8/2008 |
| KR | 10-0993775 B1 | 11/2010 |

(Continued)

*Primary Examiner* — Roberts P Culbert
(74) *Attorney, Agent, or Firm* — Innovation Counsel LLP (57) ABSTRACT

An etchant composition is presented. The composition includes: 18 wt % to 25 wt % of a first organic acid compound; 15 wt % to 20 wt % of a second organic acid compound; 8.1 wt % to 9.9 wt % of an inorganic acid compound; 1 wt % to 4.9 wt % of a sulfonic acid compound; 10 wt % to 20 wt % of a hydrogen sulfate salt compound; 1 wt % to 5 wt % of a nitrogen-containing dicarbonyl compound; 1 wt % to 5 wt % of an amino acid derivative compound; 0.1 wt % to 2 wt % of an iron-containing oxidizing agent compound; and a balance amount of water.

20 Claims, 9 Drawing Sheets

(56) References Cited

FOREIGN PATENT DOCUMENTS

| | | |
|---|---|---|
| KR | 10-2012-0075395 A | 7/2012 |
| KR | 10-1391603 B1 | 4/2014 |
| KR | 10-2014-0082246 A | 7/2014 |
| KR | 10-1459502 B1 | 11/2014 |
| KR | 10-1518055 B1 | 4/2015 |
| KR | 10-1537207 B1 | 7/2015 |
| KR | 10-2016-0100591 A | 8/2016 |
| KR | 10-2016-0122715 A | 10/2016 |
| KR | 10-1695608 B1 | 1/2017 |
| KR | 10-1776055 B1 | 9/2017 |
| KR | 10-2017-0111085 A | 10/2017 |
| KR | 10-2017-0128819 A | 11/2017 |
| WO | 2006-107176 A1 | 10/2006 |
| WO | 2013-009505 A2 | 1/2013 |

* cited by examiner

ETCHANT COMPOSITION AND MANUFACTURING METHOD OF METAL PATTERN USING THE SAME

CROSS-REFERENCE TO RELATED APPLICATION

This application claims priority to and the benefit of Korean Patent Application No. 10-2018-0046632 filed in the Korean Intellectual Property Office on Apr. 23, 2018, the entire contents of which are incorporated herein by reference.

BACKGROUND

(a) Field

The present disclosure relates to an etchant composition, and a manufacturing method of a metal pattern using the same.

(b) Description of the Related Art

A liquid crystal display (LCD), an organic light emitting diode (OLED) display, etc. are commonly used as a display device.

Such a display device includes a plurality of metal patterns. Such metal patterns are required to have effects such as improvement of conductivity or reduction of contact resistance so as to be able to realize a stable image.

In order to achieve the above-mentioned effects, the metal pattern may include a structure in which a plurality of layers made of different materials are stacked.

The above information disclosed in this Background section is only for enhancement of understanding of the background of the invention and therefore it may include information that does not form the prior art that is already known in this country to a person of ordinary skill in the art.

SUMMARY

The present invention has been made in an effort to provide an etchant composition and a manufacturing method of a metal pattern using the same that may simultaneously etch a multilayer film including different materials.

An exemplary embodiment of the present invention provides an etchant composition including: 18 wt % to 25 wt % of a first organic acid compound; 15 wt % to 20 wt % of a second organic acid compound; 8.1 wt % to 9.9 wt % of an inorganic acid compound; 1 wt % to 4.9 wt % of a sulfonic acid compound; 10 wt % to 20 wt % of a hydrogen sulfate salt compound; 1 wt % to 5 wt % of a nitrogen-containing dicarbonyl compound; 1 wt % to 5 wt % of an amino acid derivative compound; 0.1 wt % to 2 wt % of an iron-containing oxidizing agent compound; and a balance amount of water.

The first organic acid compound may include citric acid ($C_6H_8O_7$).

The second organic acid compound may include acetic acid.

The inorganic acid compound may include nitric acid.

The sulfonic acid compound may include at least one of methanesulfonic acid ($CH_3SO_3H$), p-toluenesulfonic acid ($CH_3C_6H_4SO_3H$), benzenesulfonic acid ($C_6H_5SO_3H$), aminomethylsulfonic acid ($CH_5NO_3S$), and sulfamic acid ($H_3NSO_3$).

The hydrogen sulfate salt compound may include at least one of ammonium hydrogen sulfate ($NH_4HSO_4$), potassium hydrogen sulfate ($KHSO_4$), and sodium hydrogen sulfate ($NaHSO_4$).

The nitrogen-containing dicarbonyl compound may include at least one of iminodiacetic acid ($C_4H_7NO_4$), imidazolidine-2,4-dione ($C_3H_4N_2O_2$), succinimide ($C_4H_5NO_2$), and glutarimide ($C_5H_7NO_2$).

The amino acid derivative compound may include at least one of glycine ($C_2H_5NO_2$), asparagine ($C_4H_8N_2O_3$), glutamic acid ($C_5H_9NO_4$), aspartic acid ($C_4H_7NO_4$), pyro-glutamic acid ($C_5H_7NO_3$), and hippuric acid ($C_9H_9NO_3$).

The iron-containing oxidizing agent compound may include at least one of ferric nitrate (($FeNO_3)_3$) and ferric sulfate ($Fe_2(SO_4)_3$).

Another embodiment of the present invention provides a manufacturing method of a metal pattern, including: forming a metal layer on a substrate; and etching the metal layer as a metal pattern using an etching solution composition, where the etchant composition may include: 18 wt % to 25 wt % of a first organic acid compound; 15 wt % to 20 wt % of a second organic acid compound; 8.1 wt % to 9.9 wt % of an inorganic acid compound; 1 wt % to 4.9 wt % of a sulfonic acid compound; 10 wt % to 20 wt % of a hydrogen sulfate salt compound; 1 wt % to 5 wt % of a nitrogen-containing dicarbonyl compound; 1 wt % to 5 wt % of an amino acid derivative compound; 0.1 wt % to 2 wt % of an iron-containing oxidizing agent compound; and a balance amount of water.

The metal layer may include ITO and Ag.

The metal layer may be a multilayer film.

According to the embodiment of the present invention, it is possible to reduce occurrence of impurities (for example, silver (Ag) particles) in a process of manufacturing a metal pattern. Accordingly, it is possible to prevent occurrence of a dark portion caused by penetration of impurities or the like into the display area, thereby improving reliability of a display device.

In addition, according to the embodiment of the present invention, it is possible to reduce a time and cost required for a manufacturing process by simultaneously etching a metal layer having a multilayered structure.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thickness of layers, films, panels, regions, etc. are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

Hereinafter, an etchant composition according to an exemplary embodiment will be described.

An etchant composition according to an exemplary embodiment may include 18 wt % to 25 wt % of a first organic acid compound, 15 wt % to 20 wt % of a second organic acid compound, 8.1 wt % to 9.9 wt % of an inorganic acid compound, 1 wt % to 4.9 wt % of a sulfonic acid compound, 10 wt % to 20 wt % of a hydrogen sulfate compound, 1 wt % to 5 wt % of a nitrogen-containing dicarbonyl compound, 1 wt % to 5 wt % of an amino acid derivative compound, 0.1 wt % to 2 wt % of an iron-containing oxidizing agent compound, and a balance amount of water. The balance amount may be a content for forming the total etchant composition to be 100 wt %. The weight percentage ranges provided herein are inclusive of the recited numbers.

In the etchant composition according to the exemplary embodiment, the first organic acid compound and the second organic acid compound may be an auxiliary oxidizing agent for a nitric acid (inorganic acid compound), which is a main oxidizing agent of silver (Ag). When a metal layer containing silver (Ag) is etched by using the nitric acid, the nitric acid is decomposed, and etching performance may be degraded. The first organic acid compound and the second organic acid compound may maintain a constant etch rate of the metal layer containing silver (Ag) by controlling and/or blocking a decomposition rate of the nitric acid.

An amount of the first organic acid compound may be 18 wt % to 25 wt % based on the total amount of the etchant composition; for example, it may be 20 wt % to 23 wt %. An amount of the second organic acid compound may be 15 wt % to 20 wt % based on the total amount of the etchant composition; for example, it may be 17 wt % to 19 wt %. When the amount of the first organic acid compound and the amount of the second organic acid compound are greater than the above-mentioned ranges, respectively, the etch rate of the metal layer containing silver (Ag) is excessively fast, which may cause erosion defects. When the amount of the first organic acid compound and the amount of the second organic acid compound are smaller than the above-mentioned range, a decomposition suppressing effect for a nitric acid compound may be reduced, thus stability of the etchant composition may be degraded and residues may occur.

The first organic acid compound may include citric acid ($C_6H_8O_7$), but is not limited thereto. The second organic acid compound may include acetic acid ($CH_3CO_2H$), but is not limited thereto.

The sulfonic acid compound included in the etchant composition according to an exemplary embodiment may be an auxiliary oxidizing agent. When the metal layer containing silver (Ag) is etched using nitric acid (inorganic acid compound), the nitric acid decomposes and etching performance may be degraded. The sulfonic acid compound may maintain the etch rate of the metal layer containing silver (Ag) to be constant by reducing the decomposition rate of the nitric acid.

An amount of the sulfonic acid compound may be 1 wt % to 4.9 wt % based on the total amount of the etchant composition; for example, it may be 2 wt % to 4.9 wt %. When the amount of the sulfonic acid compound is greater than 4.9 wt %, the etch rate of the metal layer containing silver (Ag) is excessively fast, which may cause erosion defects. When the amount of the sulfonic acid compound is less than 1 wt %, the decomposition suppressing effect for a nitric acid may be reduced, thus stability thereof may be degraded and residues may occur.

The sulfonic acid compound may include at least one of methanesulfonic acid ($CH_3SO_3H$), p-toluenesulfonic acid ($CH_3C_6H_4SO_3H$), benzenesulfonic acid ($C_6H_5SO_3H$), aminomethylsulfonic acid ($CH_5NO_3S$), and sulfamic acid ($H_3NSO_3$), but is not limited thereto.

The etchant composition according to the exemplary embodiment may include an inorganic acid compound, and the inorganic acid compound may include nitric acid. The inorganic acid compound (e.g., nitric acid) is a main oxidizing agent for oxidizing the metal layer containing silver (Ag).

An amount of the inorganic acid compound may be 8.1 wt % to 9.9 wt % based on the total amount of the etchant composition; for example, it may be 9 wt % to 9.9 wt %. When the amount of the inorganic acid compound is greater than 9.9 wt %, the etch rate of the metal layer is excessively fast, making it difficult to control the etching and possibly causing the metal layer to be over-etched. When the amount of the inorganic acid compound is less than 8.1 wt %, the etch rate of the metal layer decreases such that the metal layer may not be sufficiently etched.

The hydrogen sulfate salt compound is a main etchant for etching a metal oxide (e.g., ITO). In the absence of the hydrogen sulfate salt compound, the metal oxide, that is, ITO, is not etched.

An amount of the hydrogen sulfate salt compound may be 10 wt % to 20 wt % based on the total amount of the etchant composition; for example, the hydrogen sulfate salt compound may make up 12 wt % to 19 wt % of the etchant composition. When the amount of the hydrogen sulfate salt compound is greater than 20 wt %, the etch rate of an ITO film is excessively fast, which may cause erosion defects. When the amount of the hydrogen sulfate salt compound is less than 10 wt %, the etch rate of ITO decreases, possibly causing residue of ITO and Ag.

The hydrogen sulfate salt compound may include at least one of ammonium hydrogen sulfate ($NH_4HSO_4$), potassium hydrogen sulfate ($KHSO_4$), and sodium hydrogen sulfate ($NaHSO_4$), but is not limited thereto.

A nitrogen-containing dicarbonyl compound is an etch control agent for the metal oxide (ITO) and silver (Ag). The nitrogen-containing dicarbonyl compound may prevent excessive skew formation, and may prevent skew change according to concentration of silver (Ag), in a manufacturing process of the metal pattern.

An amount of the nitrogen-containing dicarbonyl compound may be 1 wt % to 5 wt % based on the total amount of the etchant composition, and for example, it may be 1 wt % to 4 wt %. When the amount of the nitrogen-containing dicarbonyl compound is greater than 5 wt %, the etch rates of ITO and Ag are excessively reduced, a skew may not be not formed, and Ag residue may occur. When the amount of the nitrogen-containing dicarbonyl compound is smaller than 1 wt %, the skew is excessively formed, and thereby a problem may occur in chemical liquid-dependent change.

The nitrogen-containing dicarbonyl compound includes at least one of iminodiacetic acid ($C_4H_7NO_4$), imidazolidine-2,4-dione ($C_3H_4N_2O_2$), succinimide ($C_4H_5NO_2$), and glutarimide ($C_5H_7NO_2$), but is not limited thereto.

The amino acid derivative compound is an etch control agent for aluminum (Al) that can control the occurrence of aluminum damage. The amino acid derivative compound may suppress reductive precipitation of silver (Ag) and tip occurrence of titanium (Ti) that may result from the aluminum damage.

Figure 9:
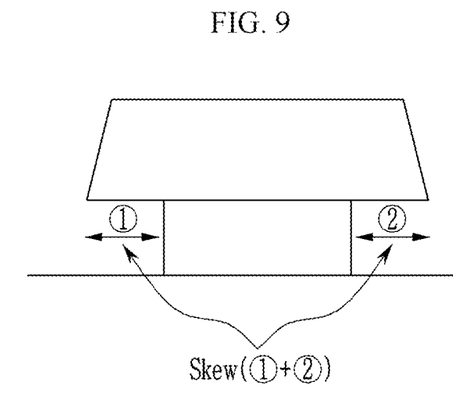
FIG. 9 illustrates "CD skew."

An amount of the amino acid derivative compound may be 1 wt % to 5 wt % based on the total amount of the etchant composition, and for example, it may be 1 wt % to 4 wt %. When the amount of the amino acid derivative compound is greater than 5 wt %, the etch rates of ITO and Ag are excessively reduced, preventing a CD-skew from forming and causing Ag residue. "CD-skew," as used herein, refers to the horizontal length that is etched by the etchant. For example, in the illustration of FIG. 9, the "CD-skew" would correspond to the distance (1)+(2). When the amount of the amino acid derivative compound is smaller than 1 wt %, the aluminum damage may occur, so that reductive precipitation of silver (Ag) and a tip of titanium (Ti) may be formed.

The amino acid derivative compound may include at least one of glycine ($C_2H_5NO_2$), asparagine ($C_4H_8N_2O_3$), glutamic acid ($C_5H_9NO_4$), aspartic acid ($C_4H_7NO_4$), pyro-glutamic acid ($C_5H_7NO_3$), and hippuric acid ($C_9H_9NO_3$), but is not limited thereto.

The iron-containing oxidizing agent compound may increase the etch rate of ITO together with the hydrogen sulfate salt compound.

An amount of the iron-containing oxidizing agent compound may be 0.1 wt % to 2 wt % based on the total amount of the etchant composition; for example, it may be 0.2 wt % to 1.8 wt %. When the amount of the iron-containing oxidizing agent compound is greater than 2 wt %, the etch rate of ITO becomes too fast, possibly causing a CD-skew to be excessively formed. When the amount of the iron-containing oxidizing agent compound is less than 0.1 wt %, the etch rate of ITO is excessively reduced, possibly causing ITO residue and Ag residue to occur.

The iron-containing oxidizing agent compound may include at least one of ferric nitrate (($FeNO_3)_3$) and ferric sulfate ($Fe_2(SO_4)_3$), but is not limited thereto.

In the present invention, even if there is no explicit description with respect to water, it is possible to make the sum of the weight percentages of the components other than water in the total etchant composition and the weight percentage of water to be 100 wt %. As the water used in the etchant composition, water of a semiconductor grade or ultrapure water may be used.

The etchant composition according to the exemplary embodiment does not include a phosphate-based compound. When the etchant composition includes a conventional insoluble phosphoric acid, the CD-skew may be excessively formed. In addition, the phosphate-based compound may cause damage to aluminum (Al) in another metal pattern, so that silver (Ag) precipitates in a reductive state or titanium (Ti) has a tip.

The etchant composition according to the exemplary embodiment may etch the metal layer including silver (Ag) through the organic acid compound and the sulfonic acid compound even if the etchant composition does not include phosphoric acid, and may etch the metal layer including ITO through the hydrogen sulfate salt compound and the iron-containing oxidizing agent compound. A metal layer having a multilayer structure including ITO and Ag may be collectively etched through the etchant composition according to the exemplary embodiment.

Since the etchant composition according to the exemplary embodiment includes a predetermined amount of the nitrogen-containing dicarbonyl compound, the dicarbonyl compound may effectively form a complex with a metal, thereby acting as an etch control agent for ITO and Ag. That is, the dicarbonyl compound may prevent excessive etching to decrease the CD-skew, and may control change of the CD-skew according to increase of Ag concentration, thereby improving the overall performance.

In addition, since the etchant composition according to the exemplary embodiment includes a predetermined amount of the amino acid derivative compound, the amino acid derivative compound may effectively form a complex with aluminum, thereby acting as an etch control agent for aluminum. The amino acid derivative compound may suppress the occurrence of aluminum damage, and may suppress reductive precipitation of Ag and occurrence of a Ti tip.

The etchant composition according to the exemplary embodiment described above may be used as an etchant for manufacturing a metal pattern provided in a display device. The metal pattern may be formed by etching and patterning a metal layer. The metal layer may include ITO and Ag, and for example, the metal layer may have a multilayer structure in which ITO, Ag, and ITO may be sequentially stacked.

Figure 1:
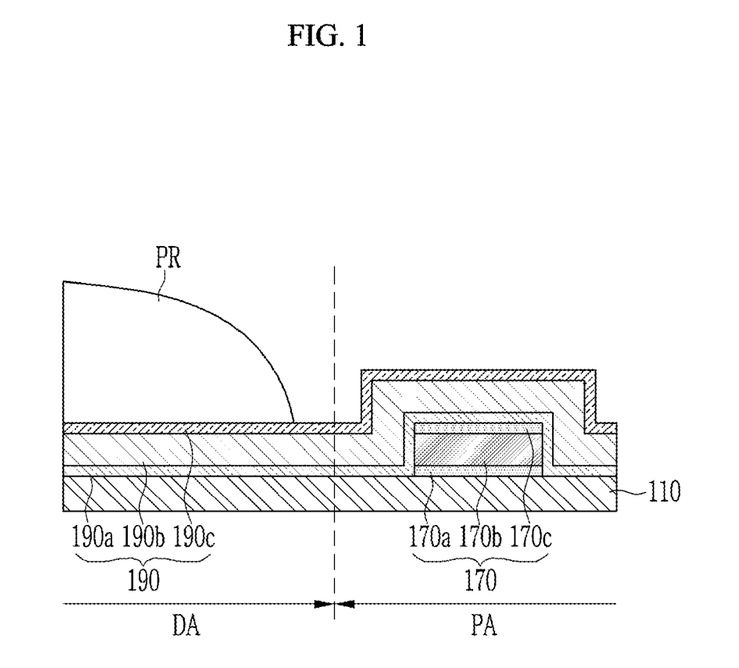
FIG. 1 and FIG. 2 illustrate a cross-sectional view of a manufacturing method of a metal pattern using an etchant composition according to an exemplary embodiment, respectively.
Figure 2:
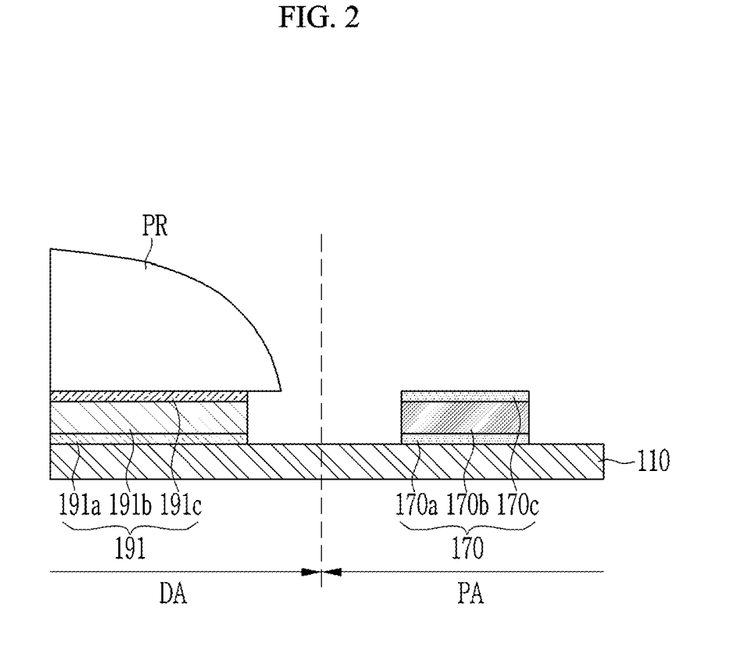

Hereinafter, a manufacturing method of a metal pattern using the etchant composition described above will be described with reference to FIG. 1 and FIG. 2. FIG. 1 and FIG. 2 illustrate a cross-sectional view of a manufacturing method of a metal pattern using the etchant composition according to the exemplary embodiment, respectively.

As shown in FIG. 1, a metal layer 190 including a first layer 190a including an ITO, a second layer 190b including Ag, and a third layer 190c including an ITO are sequentially formed on a substrate 110. The metal layer 190 may overlap some of a metal wire 170 in a peripheral portion PA disposed outside a display portion DA. Although not shown in the present specification, a thin film transistor and the like may be disposed under the metal layer 190 disposed in the display portion DA.

As shown in FIG. 2, the metal layer 190 may be etched with a metal pattern 191 using a mask pattern PR. In this case, the etchant composition described above may be used. The etchant composition is the same as described above, and will not be described below.

The etchant composition according to the exemplary embodiment may collectively etch the metal layer 190 having a multilayer structure. While collectively etching the metal layer, the etchant composition may also contact the metal wire 170 disposed in the peripheral portion PA. The metal wire 170 may include, for example, a first layer 170a including Ti, a second layer 170b including Al, and a third layer 170c including Ti.

The etchant composition according to the exemplary embodiment may include Ag ions in the process of etching the metal layer 190. However, the etchant composition according to the exemplary embodiment may include an amino acid derivative compound or the like which controls reductive precipitation of silver. Accordingly, even though the etchant composition contacts the metal wire 170, particularly the second layer 170b including aluminum, it is possible to prevent ionic silver from being precipitated in a form of particles.

Figure 3:
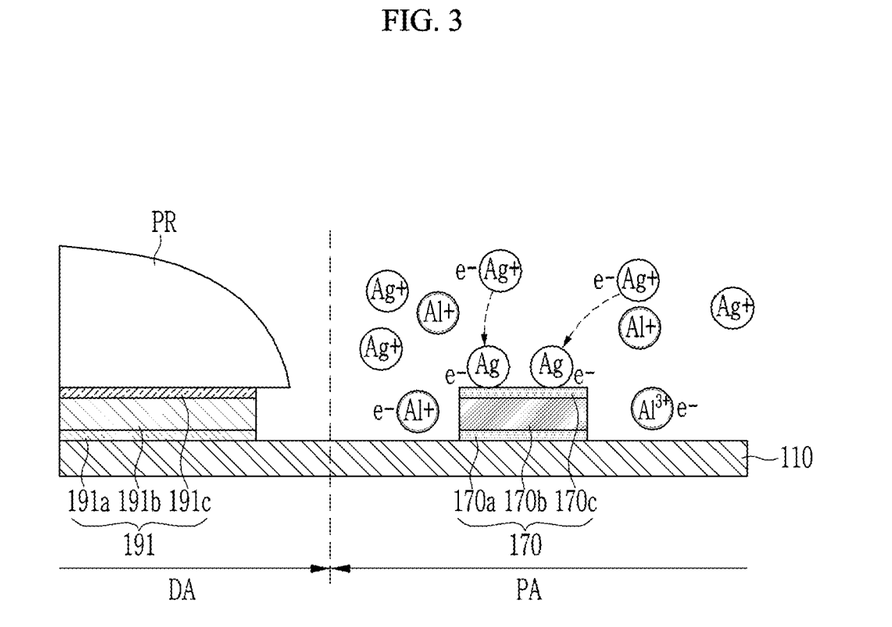
FIG. 3 and FIG. 4 illustrate a cross-sectional view of a manufacturing method of a metal pattern using an etchant composition according to a comparative example, respectively.
Figure 4:
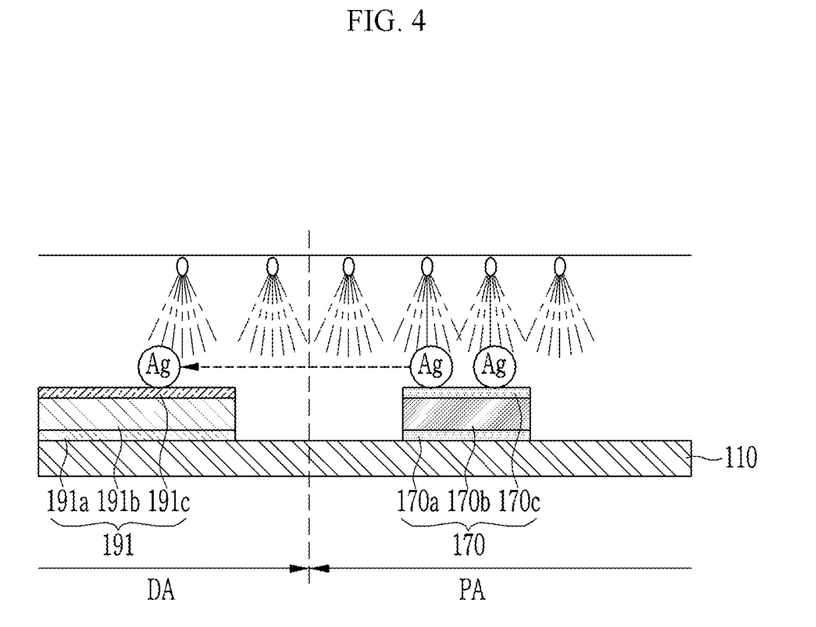

Hereinafter, a manufacturing method of a metal pattern using an etchant composition according to a comparative example will be described with reference to FIG. 3 and FIG. 4. FIG. 3 and FIG. 4 illustrate a cross-sectional view of a manufacturing method of a metal pattern using an etchant composition according to a comparative example, respectively.

As shown in FIG. 3, the metal pattern 191 may be formed using the etchant composition according to the comparative example. A method of forming the metal pattern 191 may be the same as that described with reference to FIG. 1 and FIG. 2.

Meanwhile, an etchant composition including a phosphate-based compound according to the comparative example may contact the metal wire 170. The etchant composition according to the comparative example may include Ag ions in a process of patterning a metal layer including ITO/Ag/ITO. The etchant composition according to the comparative example may receive, while contacting the metal wiring 170, electrons generated in the layer 170b containing aluminum to reduce the Ag ions to Ag particles.

As shown in FIG. 4, the reduced silver (Ag) particles may move from the peripheral portion PA to the display portion DA by a physical or chemical cleaning process. This migration of silver (Ag) particles starts when the mask pattern is removed, and may continue until other constituent elements are deposited. The silver (Ag) particles moved to the display portion DA may penetrate into a light emitting diode, or may penetrate into a thin film transistor. A dark portion may occur in the display portion DA by the Ag particles.

In order to prevent the precipitation of the reductive particles of silver, there may be a method of etching each film without collectively etching films of the multilayer structure. In this case, the cost and time required for the etching process may increase, thus the efficiency of the manufacturing process of the display device may be deteriorated.

The etchant composition according to the exemplary embodiment may prevent the reductive precipitation of silver while etching the metal layer having a multilayer structure such as ITO/Ag/ITO. When the etchant composition according to the exemplary embodiment is used, the reliability of the display device may be improved.

Hereinafter, the etchant composition according to the exemplary embodiment will be described with reference to Table 1 and Table 4.

The etchant compositions according to Exemplary Embodiments 1 to 14 and Comparative Examples 1 to 15 were prepared as shown in Table 1 below. In Table 1, a percentage (%) denotes wt %.

TABLE 1

| | Citric acid (%) | Acetic acid (%) | Methanesulfonic acid (%) | Nitric acid (%) | Sodium hydrogen sulfate | Imidazolidin-2,4-dione (%) | Pyroglutamic acid (%) | Iron nitrate (%) | Phosphate-based compound (%) |
|---|---|---|---|---|---|---|---|---|---|
| Exemplary Embodiment 1 | 18 | 15 | 3 | 9 | 15 | 3 | 3 | 1 | 0 |
| Exemplary Embodiment 2 | 25 | 20 | 3 | 9 | 15 | 3 | 3 | 1 | 0 |
| Exemplary Embodiment 3 | 22 | 18 | 1 | 9 | 15 | 3 | 3 | 1 | 0 |
| Exemplary Embodiment 4 | 22 | 18 | 4.9 | 9 | 15 | 3 | 3 | 1 | 0 |
| Exemplary Embodiment 5 | 22 | 18 | 3 | 8.1 | 15 | 3 | 3 | 1 | 0 |
| Exemplary Embodiment 6 | 22 | 18 | 3 | 9.9 | 15 | 3 | 3 | 1 | 0 |
| Exemplary Embodiment 7 | 22 | 18 | 3 | 9 | 10 | 3 | 3 | 1 | 0 |
| Exemplary Embodiment 8 | 22 | 18 | 3 | 9 | 20 | 3 | 3 | 1 | 0 |
| Exemplary Embodiment 9 | 22 | 18 | 3 | 9 | 15 | 1 | 3 | 1 | 0 |
| Exemplary Embodiment10 | 22 | 18 | 3 | 9 | 15 | 5 | 3 | 1 | 0 |
| Exemplary Embodiment 11 | 22 | 18 | 3 | 9 | 15 | 3 | 1 | 1 | 0 |

TABLE 1-continued

| | Citric acid (%) | Acetic acid (%) | Methanesulfonic acid (%) | Nitric acid (%) | Sodium hydrogen sulfate | Imidazolidin-2,4-dione (%) | Pyro-glutamic acid (%) | Iron nitrate (%) | Phosphate-based compound (%) |
|---|---|---|---|---|---|---|---|---|---|
| Exemplary Embodiment 12 | 22 | 18 | 3 | 9 | 15 | 3 | 5 | 1 | 0 |
| Exemplary Embodiment 13 | 22 | 18 | 3 | 9 | 15 | 3 | 3 | 0.1 | 0 |
| Exemplary Embodiment 14 | 22 | 18 | 3 | 9 | 15 | 3 | 3 | 2 | 0 |
| Comparative Example 1 | 16 | 13 | 3 | 9 | 15 | 3 | 3 | 1 | 0 |
| Comparative Example 2 | 27 | 22 | 3 | 9 | 15 | 3 | 3 | 1 | 0 |
| Comparative Example 3 | 22 | 18 | 0.5 | 9 | 15 | 3 | 3 | 1 | 0 |
| Comparative Example 4 | 22 | 18 | 5.5 | 9 | 15 | 3 | 3 | 1 | 0 |
| Comparative Example 5 | 22 | 18 | 3 | 7 | 15 | 3 | 3 | 1 | 0 |
| Comparative Example 6 | 22 | 18 | 3 | 12 | 15 | 3 | 3 | 1 | 0 |
| Comparative Example 7 | 22 | 18 | 3 | 9 | 8 | 3 | 3 | 1 | 0 |
| Comparative Example 8 | 22 | 18 | 3 | 9 | 23 | 3 | 3 | 1 | 0 |
| Comparative Example 9 | 22 | 18 | 3 | 9 | 15 | 0.5 | 3 | 1 | 0 |
| Comparative Example 10 | 22 | 18 | 3 | 9 | 15 | 7 | 3 | 1 | 0 |
| Comparative Example 11 | 22 | 18 | 3 | 9 | 15 | 3 | 0.5 | 1 | 0 |
| Comparative Example 12 | 22 | 18 | 3 | 9 | 15 | 3 | 7 | 1 | 0 |
| Comparative Example 13 | 22 | 18 | 3 | 9 | 15 | 3 | 3 | 0.01 | 0 |
| Comparative Example 14 | 22 | 18 | 3 | 9 | 15 | 3 | 3 | 3 | 0 |
| Comparative Example 15 | 22 | 18 | 3 | 9 | 15 | 3 | 3 | 1 | 1 |

In Comparative Example 1, the total amount of the organic acids is less than 40 wt %. When the amount of the methanesulfonic acid is small as in Comparative Example 3, or when the amount of the inorganic acid is small as in Comparative Example 5, the ability of etching silver (Ag) may decrease, thus the residue may occur. When the amount of the organic acid is more than 50 wt % as in Comparative Example 2, when the amount of the methanesulfonic acid is large as in Comparative Example 4, or when the amount of the nitric acid, which is an inorganic acid compound, is large as in Comparative Example 6, the etch rate of silver (Ag) significantly increases, causing excessive formation of the CD-skew.

Also, as in Comparative Example 5, Comparative Example 7, and Comparative Example 13, when the amounts of the constituent elements thereof are smaller than those according to the exemplary embodiment, the ability of etching ITO decreases, thus the residue may occur. As in Comparative Example 6, Comparative Example 8, and Comparative Example 14, when the amounts of the constituent elements thereof are larger than those according to the exemplary embodiment, the ability of etching ITO excessively increases, causing excessive formation of the CD-skew.

In the case of Comparative Example 9, the amount of the nitrogen-containing dicarbonyl compound is less than in the exemplary embodiment, and thus the stability of the etchant composition is compromised. As a consequence, the CD-skew control, the cumulative number, and the stability test result (time vs. metal accumulation) may be degraded. In the case of Comparative Example 10, the etch rate for ITO and silver (Ag) excessively decreases, thus the formation of the metal pattern may deteriorate and the Ag residue may occur.

In the case of Comparative Example 11, the amount of the amino acid derivative compound is less than in the exemplary embodiment. In the case of Comparative Example 11, the ability to control etching aluminum is compromised, possibly causing aluminum damage. The aluminum damage may, in turn, cause the reductive precipitation of silver and the tip generation of titanium. The amount of the amino acid derivative of Comparative Example 12 is greater than in the exemplary embodiment. Comparative Example 12 may excessively reduce the etch rate for ITO and silver (Ag) in addition to aluminum. Accordingly, the formation of the metal pattern may deteriorate and the Ag residue may occur.

Comparative Example 15 includes a phosphoric acid compound. Comparative Example 15 causes the reductive precipitation of silver, the aluminum damage in a lower wire, and the titanium tip. This will now be described in detail.

Experimental Example 1: Measurement of Etch Rate, CD Skew (One-Sided), Residue, and Particle Precipitation of Particle Precipitation The etch rate (E/R), the CD skew (one-sided), the residue, and the particle precipitation were measured for respective samples including the stacked ITO/Ag/ITO triple-layer and the photoresist pattern with the etchant compositions of Examples 1 to 14 and Comparative Examples 1 to 15 described above, using a scope and a SEM photograph, and the measured results are shown in Table 2 below.

The acceptable etch rate of ITO/Ag/ITO is in a range of 20 Å/s to 22 Å/s. The CD (cut dimension) skew (one sided) corresponds to a distance between an end of the mask pattern (an end of the photoresist) and an end of the ITO/Ag/ITO. An acceptable range of the CD skew (one-sided) is 0.2 μm to 0.3 μm. It is preferable for even a very small amount of the residue and of the precipitation to not exist.

TABLE 2

Etching Characteristics of Example and Comparative Embodiments

| | Etching characteristic | | | |
|---|---|---|---|---|
| | ITO/Ag/ITO E/R (Å Å/s) | CD-skew (one-sided, μm) | Residue | Precipitation |
| Exemplary Embodiment 1 | 20 | 0.2108 | Nonexistence | Nonexistence |
| Exemplary Embodiment 2 | 22 | 0.2927 | Nonexistence | Nonexistence |
| Exemplary Embodiment 3 | 20 | 0.2459 | Nonexistence | Nonexistence |
| Exemplary Embodiment 4 | 22 | 0.2650 | Nonexistence | Nonexistence |
| Exemplary Embodiment 5 | 20 | 0.2106 | Nonexistence | Nonexistence |
| Exemplary Embodiment 6 | 22 | 0.2847 | Nonexistence | Nonexistence |
| Exemplary Embodiment 7 | 20 | 0.2419 | Nonexistence | Nonexistence |
| Exemplary Embodiment 8 | 22 | 0.2614 | Nonexistence | Nonexistence |
| Exemplary Embodiment 9 | 22 | 0.2849 | Nonexistence | Nonexistence |
| Exemplary Embodiment 10 | 20 | 0.2226 | Nonexistence | Nonexistence |
| Exemplary Embodiment 11 | 22 | 0.2885 | Nonexistence | Nonexistence |
| exemplary embodiment 12 | 20 | 0.2379 | Nonexistence | Nonexistence |
| Exemplary Embodiment 13 | 20 | 0.2380 | Nonexistence | Nonexistence |
| Exemplary Embodiment 14 | 22 | 0.2810 | Nonexistence | Nonexistence |
| Comparative Example 1 | 16 | 0.1676 | Existence | Nonexistence |
| Comparative Example 2 | 26 | 0.4167 | Nonexistence | Nonexistence |
| Comparative Example 3 | 17 | 0.1796 | Existence | Nonexistence |
| Comparative Example 4 | 24 | 0.3629 | Nonexistence | Nonexistence |
| Comparative Example 5 | 16 | 0.1600 | Existence | Nonexistence |
| Comparative Example 6 | 24 | 0.3607 | Nonexistence | Nonexistence |
| Comparative Example 7 | 18 | 0.1833 | Existence | Nonexistence |
| Comparative Example 8 | 24 | 0.3276 | Nonexistence | Nonexistence |
| Comparative Example 9 | 24 | 0.3712 | Nonexistence | Nonexistence |
| Comparative Example 10 | 17 | 0.1755 | Existence | Nonexistence |
| Comparative Example 11 | 22 | 0.2809 | Nonexistence | Existence |
| Comparative Example 12 | 16 | 0.1638 | Existence | Nonexistence |
| Comparative Example 13 | 16 | 0.1600 | Existence | Nonexistence |
| Comparative Example 14 | 26 | 0.4605 | Nonexistence | Nonexistence |
| Comparative Example 15 | 26 | 0.4446 | Nonexistence | Existence |

Referring to Table 2, the ITO/Ag/ITO etch rate (Ag E/R) of the etchant compositions according to Exemplary Embodiments 1 to 14 was satisfactory at 20 to 22 Å/s. The CD-skew (one-sided) was satisfactory at 0.2 μm to 0.3 μm, and no residue or precipitation were found. In contrast, Comparative Examples 1, 3, 5, 7, 10, 12, and 13 did not satisfy the appropriate ranges in all characteristics except the precipitation. Comparative Examples 2, 4, 6, 8, 9, and 14 satisfied the characteristics required for the residue and precipitation, but did not satisfy the characteristics required for the ITO/Ag/ITO etch rate and the CD-skew. Comparative Example 11 did not satisfy the characteristic required for the precipitation.

In the case of the etchant compositions according to Comparative Examples 2, 4, 6, 8, 9, and 14, as shown in Table 2, no residues occurred when the etching characteristics of the ITO/Ag/ITO were in acceptable ranges. However, when the etching characteristics of the ITO/Ag/ITO were not in the acceptable ranges, the CD-skew was not satisfied due to excessive etching.

Since the ITO/Ag/ITO etch rate increased and the CD-skew greatly increased as the phosphate-based compound was included, the etchant composition according to Comparative Example 15 exceeded the required range. In addition, the reductive precipitation of silver occurred due to the phosphate-based compound.

Experimental Example 2: Reliability Evaluation According to Increase of Number of Treatments of Etchant Composition Regarding the etchant composition according to Exemplary Embodiment 1 described above, while increasing Ag ion concentration, the processed number of substrates were evaluated as follows. Reference etch was performed using the etchant composition of Exemplary Embodiment 1 to obtain reference test results (Ref). Thereafter, the etch test was performed while increasing the Ag powder concentration by 500 ppm, and the results in comparison to the reference test results are summarized in Table 3 below.

TABLE 3

Etch Results at Different Ag Powder Concentrations

|  | Ref | 500 ppm | 1000 ppm | 1500 ppm | 2000 ppm |
|---|---|---|---|---|---|
| ITO/Ag/ITO E/R | ◎ | ◎ | ◎ | ◎ | ◎ |
| CD-skew (one-sided) | ◎ | ◎ | ◎ | ◎ | ◎ |
| Residue | ◎ | ◎ | ◎ | ◎ | ◎ |
| Precipitation | ◎ | ◎ | ◎ | ◎ | ◎ |

◎: Excellent (less than 10% change in comparison to reference result)
X: Poor (more than 10% change in comparison to reference result)

Referring to Table 3, according to Exemplary Embodiment 1, it can be confirmed that even when the Ag ion concentration in the etchant composition was increased, the etch rate, the CD skew, the residue, and the precipitation change were not large. Therefore, it can be seen that the etchant composition according to the exemplary embodiment has reliability.

Experimental Example 3: Reliability Evaluation According to Increase of Time-Dependent Change of Etchant Composition Regarding the etchant composition according to Exemplary Embodiment 1, while increasing the time-dependent change, the time-dependent change of the substrate was evaluated as follows. Reference etch was performed using the etchant composition according to Exemplary Embodiment 1 to obtain the reference test result (Ref). Thereafter, the etch test was performed every 12 hours, and the results in comparison to the reference test results (Ref) are summarized in Table 4 below.

TABLE 4

Effect of Etch Duration on Etch Results

|  | Ref | 12 h | 24 h | 36 h | 48 h | 60 h | 72 h |
|---|---|---|---|---|---|---|---|
| ITO/Ag/ITO E/R | ◎ | ◎ | ◎ | ◎ | ◎ | ◎ | ◎ |
| CD-skew (one-sided) | ◎ | ◎ | ◎ | ◎ | ◎ | ◎ | ◎ |
| Residue | ◎ | ◎ | ◎ | ◎ | ◎ | ◎ | ◎ |
| Precipitation | ◎ | ◎ | ◎ | ◎ | ◎ | ◎ | ◎ |

◎: Excellent (less than 10% change in comparison to reference result)
X: Poor (more than 10% change in comparison to reference result)

Referring to Table 4, in Exemplary Embodiment 1 according to Exemplary Embodiment 1, it can be confirmed that even when the time-dependent change was increased, the etch rate, the CD skew, the residue, and the precipitation change were not large. Therefore, it can be seen that the etchant composition according to the exemplary embodiment has reliability.

Figure 5:
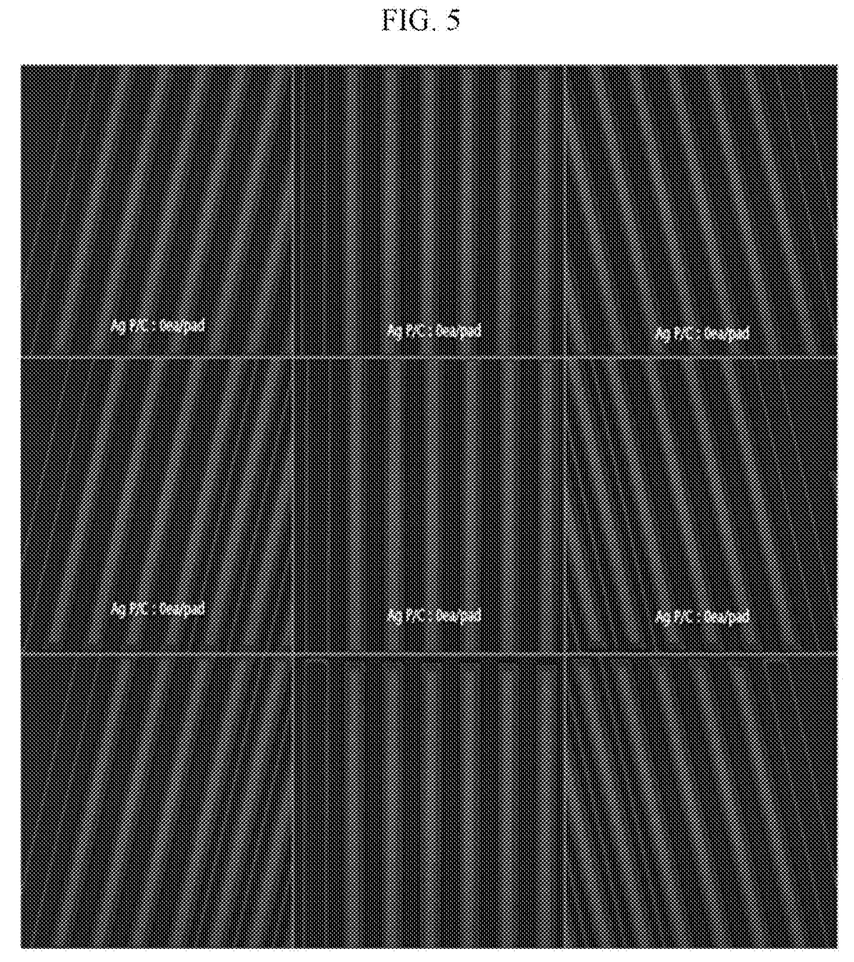
FIG. 5 illustrates an image of a metal pattern manufactured by using an etchant composition according to an exemplary embodiment.

Hereinafter, the metal patterns manufactured by using the etchant compositions according to the exemplary embodiments and the comparative examples will be described with reference to FIG. 5 to FIG. 8. FIG. 5 illustrates an image of a metal pattern manufactured by using an etchant composition according to an exemplary embodiment, FIG. 6 illustrates an image of a metal pattern (which includes 2000 ppm of silver (Ag)) manufactured by using an etchant composition according to an exemplary embodiment, FIG. 7 illustrates an image of a metal pattern manufactured by using an etchant composition according to a comparative example, and FIG. 8 illustrates an effect graph derived using an etchant composition according to an exemplary embodiment.

FIG. 5 illustrates the image of the metal pattern formed by using the etchant composition according to the exemplary embodiment. The etchant composition may include few silver ions. As such, when the metal pattern is formed using the etchant composition, it can be seen that few silver particles are precipitated as shown in FIG. 5. It was confirmed that particles were precipitated in a level of an average of 0 ea/pad.

Figure 6:
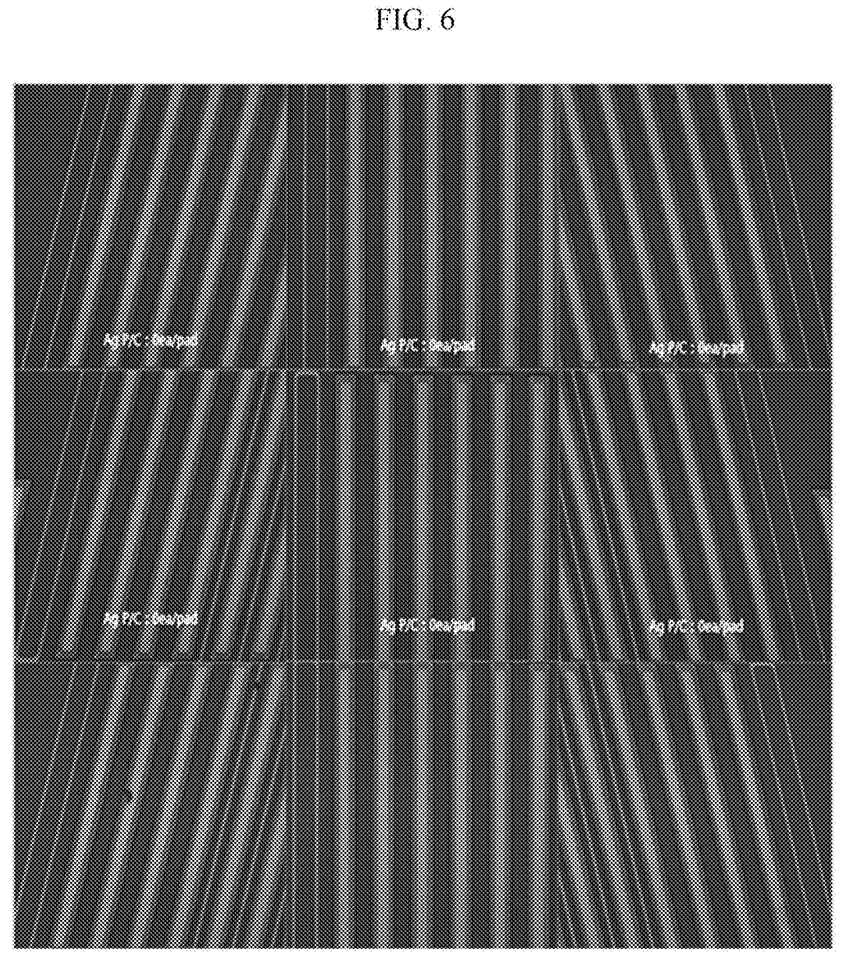
FIG. 6 illustrates an image of a metal pattern (which includes 2000 ppm of silver (Ag)) manufactured by using an etchant composition according to an exemplary embodiment.

FIG. 6 illustrates the image of the metal pattern formed by using the etchant composition according to the exemplary embodiment. The etchant composition includes silver ions at about 2000 ppm. As such, even when the metal pattern is formed using the etchant composition including the silver ions, it can be seen that few silver particles are precipitated as shown in FIG. 6. It was confirmed that although the etchant composition included the silver ions, the particles were precipitated in a level of an average of 0 ea/pad.

Figure 7:
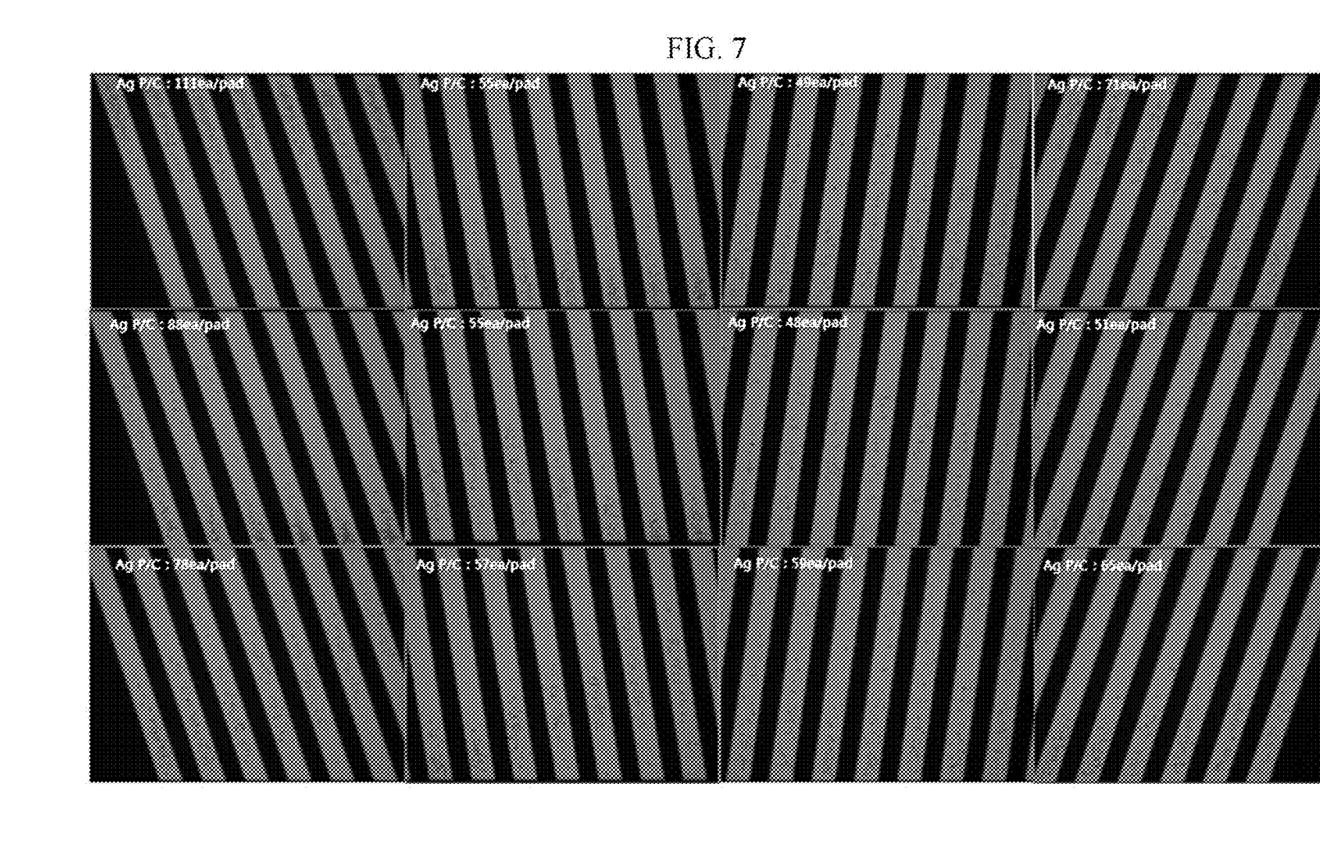
FIG. 7 illustrates an image of a metal pattern manufactured by using an etchant composition according to a comparative example.
Figure 8:
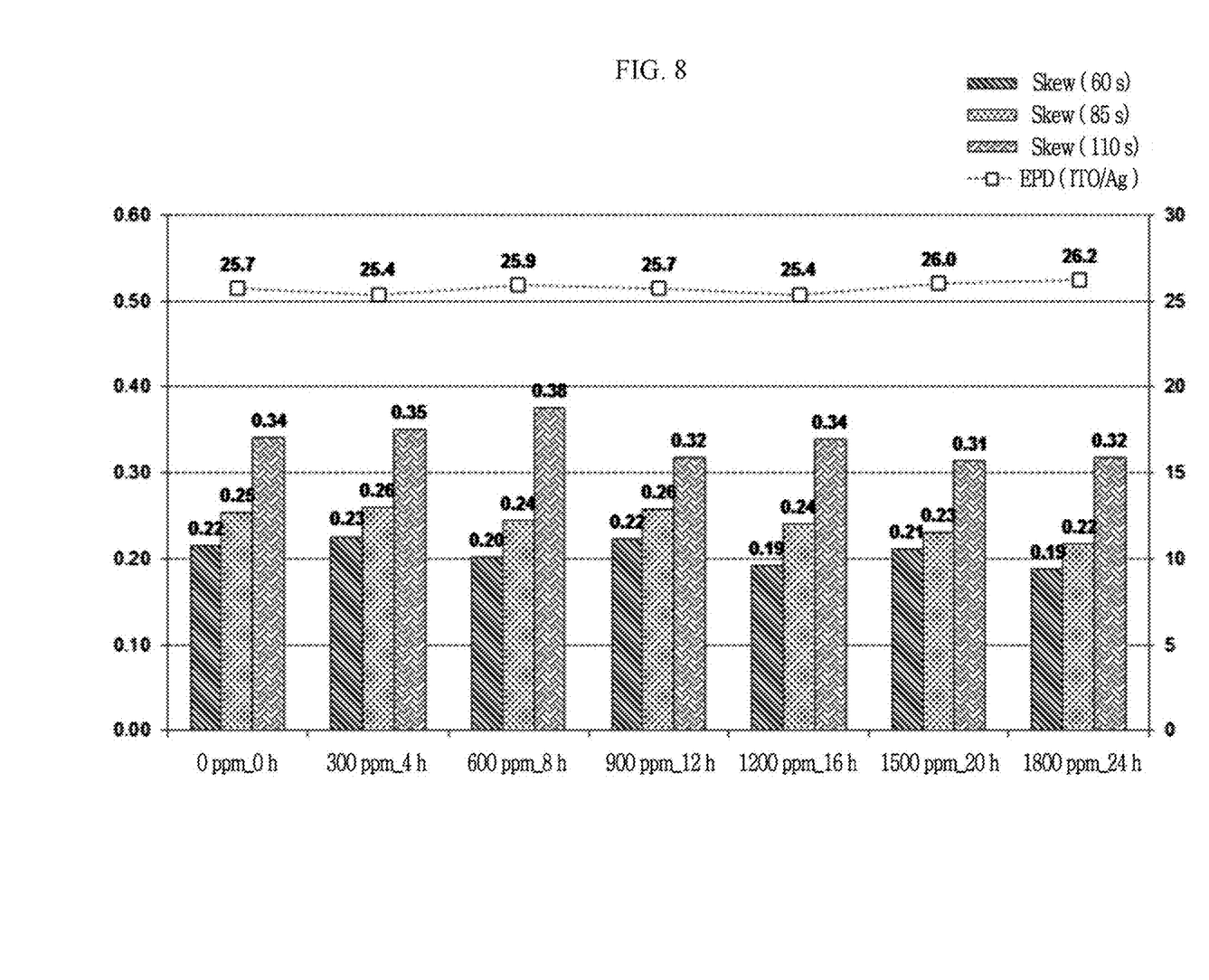
FIG. 8 illustrates an effect graph derived using an etchant composition according to an exemplary embodiment.

FIG. 7 illustrates an image of a case in which the metal pattern was formed using the etchant composition including the phosphate-based compound according to the comparative example. As shown in FIG. 7, it can be seen that a plurality of particles are precipitated in each metal pattern. It was confirmed that the silver particles were precipitated in a level of an average 65.6 ea/pad.

TABLE 5

Metal Pattern Formation Using Phosphate-based Etchant

| 41° C. | 0 ppm_0 h | 300 ppm_4 h | 600 ppm_8 h | 900 ppm_12 h | 1200 ppm_16 h | 1500 ppm_20 h | 2000 ppm_24 h |
|---|---|---|---|---|---|---|---|
| EPD (ITO/Ag) | 25.7 | 25.4 | 25.9 | 25.7 | 25.4 | 26.0 | 26.2 |
| Skew (60 s) | 0.22 | 0.23 | 0.20 | 0.22 | 0.19 | 0.21 | 0.19 |
| Skew (85 s) | 0.25 | 0.26 | 0.24 | 0.26 | 0.24 | 0.23 | 0.22 |
| Skew (110 s) | 0.34 | 0.35 | 0.38 | 0.32 | 0.34 | 0.31 | 0.32 |
| Number of Ag particles | 2 ea/pad | 2 ea/pad | 2 ea/pad | 2 ea/pad | 2 ea/pad | 2 ea/pad | 2 ea/pad |

As used herein, "ppm" indicates the concentration of dissolved Ag (metal) and "ppm_4 h" indicates that an appropriate amount of Ag is dissolved and circulated for 4 hours (4 hrs=time+metal mixing time). Referring to FIG. 8 and Table 5, it was confirmed that although the amount of silver ions of the etchant composition according to the exemplary embodiment increased from 0 ppm to 1800 ppm, the EPD satisfied a range of 24 to 26, the skew at 85 seconds satisfies a range of 0.2 to 0.25 µm, and an amount of the precipitated silver particles was equal to or less than 2 ea/pad. In other words, it was confirmed that even when the concentration of Ag ions was increased by using the etchant composition a plurality of times, physical properties required for the etchant composition were maintained to be constant.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An etchant composition comprising:
    18 wt % to 25 wt % of a first organic acid compound;
    15 wt % to 20 wt % of a second organic acid compound;
    8.1 wt % to 9.9 wt % of an inorganic acid compound;
    1 wt % to 4.9 wt % of a sulfonic acid compound;
    10 wt % to 20 wt % of a hydrogen sulfate salt compound;
    1 wt % to 5 wt % of a nitrogen-containing dicarbonyl compound;
    1 wt % to 5 wt % of an amino acid derivative compound;
    0.1 wt % to 2 wt % of an iron-containing oxidizing agent compound; and
    a balance amount of water.

2. The etchant composition of claim 1, wherein the first organic acid compound includes citric acid ($C_6H_8O_7$).

3. The etchant composition of claim 1, wherein the second organic acid compound includes acetic acid.

4. The etchant composition of claim 1, wherein the inorganic acid compound includes nitric acid.

5. The etchant composition of claim 1, wherein the sulfonic acid compound includes at least one of methanesulfonic acid ($CH_3SO_3H$), p-toluenesulfonic acid ($CH_3C_6H_4SO_3H$), benzenesulfonic acid ($C_6H_5SO_3H$), aminomethylsulfonic acid ($CH_5NO_3S$), and sulfamic acid ($H_3NSO_3$).

6. The etchant composition of claim 1, wherein the hydrogen sulfate salt compound includes at least one of ammonium hydrogen sulfate ($NH_4HSO_4$), potassium hydrogen sulfate ($KHSO_4$), and sodium hydrogen sulfate ($NaHSO_4$).

7. The etchant composition of claim 1, wherein the nitrogen-containing dicarbonyl compound includes at least one of iminodiacetic acid ($C_4H_7NO_4$), imidazolidine-2,4-dione ($C_3H_4N_2O_2$), succinimide ($C_4H_5NO_2$), and glutarimide ($C_5H_7NO_2$).

8. The etchant composition of claim 1, wherein the amino acid derivative compound includes at least one of glycine ($C_2H_5NO_2$), asparagine ($C_4H_8N_2O_3$), glutamic acid ($C_5H_9NO_4$), aspartic acid ($C_4H_7NO_4$), pyroglutamic acid ($C_5H_7NO_3$), and hippuric acid ($C_9H_9NO_3$).

9. The etchant composition of claim 1, wherein the iron-containing oxidizing agent compound includes at least one of ferric nitrate (($FeNO_3)_3$) and ferric sulfate ($Fe_2(SO_4)_3$).

10. A manufacturing method of a metal pattern, comprising:
    forming a metal layer on a substrate; and
    etching the metal layer as a metal pattern using an etching solution composition,
    where the etchant composition includes:
    18 wt % to 25 wt % of a first organic acid compound;
    15 wt % to 20 wt % of a second organic acid compound;
    8.1 wt % to 9.9 wt % of an inorganic acid compound;
    1 wt % to 4.9 wt % of a sulfonic acid compound;
    10 wt % to 20 wt % of a hydrogen sulfate salt compound;
    1 wt % to 5 wt % of a nitrogen-containing dicarbonyl compound;
    1 wt % to 5 wt % of an amino acid derivative compound;
    0.1 wt % to 2 wt % of an iron-containing oxidizing agent compound; and
    a balance amount of water.

11. The manufacturing method of the metal pattern of claim 10, wherein the metal layer includes ITO and Ag.

12. The manufacturing method of the metal pattern of claim 10, wherein the metal layer is a multilayer film.

13. The manufacturing method of the metal pattern of claim 12, wherein the etchant composition collectively etches the multilayer film.

14. The manufacturing method of the metal pattern of claim 10, wherein the first organic acid compound includes citric acid ($C_6H_8O_7$), and the second organic acid compound includes acetic acid.

15. The manufacturing method of the metal pattern of claim 10, wherein the inorganic acid compound includes nitric acid.

16. The manufacturing method of the metal pattern of claim 10, wherein the sulfonic acid compound includes at least one of methanesulfonic acid ($CH_3SO_3H$), p-toluenesulfonic acid ($CH_3C_6H_4SO_3H$), benzenesulfonic acid ($C_6H_5SO_3H$), aminomethylsulfonic acid ($CH_5NO_3S$), and sulfamic acid ($H_3NSO_3$).

17. The manufacturing method of the metal pattern of claim 10, wherein
the hydrogen sulfate salt compound includes at least one of ammonium hydrogen sulfate ($NH_4HSO_4$), potassium hydrogen sulfate ($KHSO_4$), and sodium hydrogen sulfate ($NaHSO_4$).

18. The manufacturing method of the metal pattern of claim 10, wherein
the nitrogen-containing dicarbonyl compound includes at least one of iminodiacetic acid ($C_4H_7NO_4$), imidazolidine-2,4-dione ($C_3H_4N_2O_2$), succinimide ($C_4H_5NO_2$), and glutarimide ($C_5H_7NO_2$).

19. The manufacturing method of the metal pattern of claim 10, wherein
the amino acid derivative compound includes at least one of glycine ($C_2H_5NO_2$), asparagine ($C_4H_8N_2O_3$), glutamic acid ($C_5H_9NO_4$), aspartic acid ($C_4H_7NO_4$), pyroglutamic acid ($C_5H_7NO_3$), and hippuric acid ($C_9H_9NO_3$).

20. The manufacturing method of the metal pattern of claim 10, wherein
the iron-containing oxidizing agent compound includes at least one of ferric nitrate (($FeNO_3)_3$) and ferric sulfate ($Fe_2(SO_4)_3$).

* * * * *